United States Patent [19]

Sachdev et al.

[11] Patent Number: 5,422,223
[45] Date of Patent: Jun. 6, 1995

[54] SILICON-CONTAINING POSITIVE RESIST AND USE IN MULTILAYER METAL STRUCTURES

[75] Inventors: Krishna G. Sachdev; Harbans S. Sachdev, both of Hopewell Junction; Joel R. Whitaker, Port Ewen, all of N.Y.

[73] Assignee: International Business Machines Corporation, Armonk, N.Y.

[21] Appl. No.: 274,572

[22] Filed: Jul. 13, 1994

Related U.S. Application Data

[63] Continuation of Ser. No. 876,277, Apr. 30, 1992, abandoned.

[51] Int. Cl.$^6$ .................... G03F 7/021; G03F 7/075; G03F 7/36
[52] U.S. Cl. .................... 430/190; 430/166; 430/192; 430/193; 430/313; 430/317; 430/323; 430/327
[58] Field of Search ............... 430/192, 193, 165, 191, 430/190, 166, 314, 317, 313, 323, 327

[56] References Cited

U.S. PATENT DOCUMENTS

| | | | |
|---|---|---|---|
| 4,745,169 | 5/1988 | Sugiyama et al. | 430/192 |
| 4,770,897 | 9/1988 | Wu | 437/228 |
| 4,789,648 | 12/1988 | Chow et al. | 437/225 |
| 4,992,596 | 2/1991 | Jeffries, III et al. | 430/190 |
| 5,115,090 | 5/1992 | Sachdev et al. | 528/353 |

FOREIGN PATENT DOCUMENTS

| | | | |
|---|---|---|---|
| 0147127 | 11/1984 | European Pat. Off. | |
| 0229629 | 7/1987 | European Pat. Off. | |
| 0365881 | 4/1989 | European Pat. Off. | |
| 58-48045 | 3/1983 | Japan | 430/190 |
| 62-212645 | 9/1987 | Japan | 430/190 |
| 1222254 | 5/1989 | Japan | |
| 232354 | 2/1990 | Japan | 430/190 |

OTHER PUBLICATIONS

A. Tanaka, et al., Journal of Vacuum Science & Technology B7, "Resolution Characteristics of a Novel Silicone-based Positive Photoresist", May/Jun., 1989, No. 3, New York.

*Primary Examiner*—Charles L. Bowers, Jr.
*Assistant Examiner*—John S. Chu
*Attorney, Agent, or Firm*—Dale M. Crockatt

[57] ABSTRACT

Photosensitive silicon-containing resist compositions comprising hydroxyphenylsilsesquioxanes and siloxanes partially estersified with diazonaphthoquinone sulfonyloxy groups for imageable $O_2$ RIE barrier films. Methods for forming image patterns on substrates using these photosensitive silicon-containing resist compositions are also provided.

4 Claims, No Drawings

SILICON-CONTAINING POSITIVE RESIST AND USE IN MULTILAYER METAL STRUCTURES

This application is a continuation of application Ser. No. 07/876,277, filed Apr. 30, 1992, now abandoned.

FIELD OF THE INVENTION

This invention relates to photosensitive silicon-containing resist compositions comprising silsesquioxane and aromatic siloxane resins having diazonaphthoquinone sulfonyloxy groups covalently bonded thereto. The invention also relates to the use of these photosensitive silicon-containing resist compositions as imageable $O_2$ RIE (reactive-ion-etch) barrier films. Such barrier films are particularly useful in bilayer lithographic processes to pattern polyimide underlayers in the fabrication of multilayer interconnect structures.

BACKGROUND ART

Imageable silicon-containing polymer films comprising components which impart resistance to oxygen reactive-ion-etching ($O_2$ RIE) have utility as resist layers in bilayer lithographic processes wherein a resist pattern is transferred into underlying polymer films by $O_2$ RIE with the top layer serving as a RIE mask during the etching process. Bilayer lithographic approaches are preferred over the standard tri-layer or multi-layer resist (MLR) processes because they require fewer operations and thus provide process simplification. The MLR processes are generally based on a three layer stack comprising an organic polymer underlayer/RIE mask/imaging layer structure in which the RIE mask may be silicon oxide, silicon nitride, silicon oxynitride, plasma deposited organosilicons or solution coated siloxane polymers including "glass resins", or silicon containing polyimides, and the imaging layer is formed from any of the standard photoresist formulations such as AZ 1350J or other positive or negative working photoresists well known in the art.

Fabrication of high density multilayer copper/polyimide interconnections in thin film technology utilizing dry-etch techniques, generally requires extended $O_2$ RIE to etch patterns into relatively thick polymer underlayers. Commonly used underlayers in high temperature metallization processes include soluble polyimides for metal lift-off schemes and polyimide dielectric materials for insulating metal circuits.

Typical multilayer lithographic schemes in thin film fabrication are described in U.S. Pat. Nos. 4,789,648, 4,770,897, and U.S. patent application Ser. No. 07/740,760, filed Aug. 15, 1991, Attorney Docket No. FI9-91-086 the disclosure of which is incorporated herein by reference, which describes applications of low TCE polyimides as improved insulator for high conductivity metallurgical circuits in semiconductor device and packaging technologies.

Bilayer lithography offers an alternative method of patterning polyimide underlayers by dry etching and can provide significant simplification in the overall process. However, successful application of a bilayer process in the fabrication of multilayer thin film structures using polyimides requires that the top resist mask (imageable $O_2$ RIE mask) have the following functional characteristics: high $O_2$ etch resistance to provide high etch-rate-ratio with respect to the underlying polymer layer; no change in lithographic performance when used in conjunction with polyimide underlayers that are cast from NMP as solvent; mechanical integrity during extended $O_2$ RIE, there should be no cracking, crazing, or image flow during image transfer; good adhesion to the underlying polymer at all levels of processing; and compatibility of the resist with the underlayer such that resist application causes no cracking or surface crazing in the underlayer. In addition to these requirements, the resist should provide defect-free films, should have good shelf-life, reproducible performance in terms of dose requirement and image resolution, and should be stable to environmental effects.

SUMMARY OF THE INVENTION

It is an object of this invention to provide one-component, silicon-containing, environmentally stable, aqueous base developable, positive resist systems for use as $O_2$ RIE resistant imaging layer in bilayer lithography to pattern soluble polyimide underlayers in lift-off metallization schemes and patterning of polyimide dielectric layers in the fabrication of thin film multilayer-metal structures.

For successful application of a bilayer process in the fabrication of multilayer thin film structures in packaging technology requiring relatively thick underlayers, the imageable $O_2$ RIE mask must have the following necessary functional characteristics: High 2 etch resistance to provide high etch-rate-ratio with respect to the underlying polymer layer; mechanical integrity during extended RIE, i.e., there should be no cracking, crazing, or image flow; good adhesion to the underlying polymer at all levels of processing; compatibility of the resist with the underlayer such that the resist application causes no cracking or surface crazing in the underlayer. In addition to these requirements, the resist should provide defect-free films, good shelf-life, reproducible performance in terms of dose requirement and image resolution, and preferably be free of sensitivity to environmental contaminants.

This invention also provides imageable $O_2$ RIE barrier with high etch resistance such that less than about 0.5 $\mu$m thick barrier film is sufficient for replication of its pattern into more than 10 $\mu$m thick polyimide underlayers by dry etching using $O_2$ RIE.

Another object of this invention is to provide bilayer lithographic schemes for process simplification in the fabrication of thin-film multilayer structures whereby residue-free patterns are formed in underlying polyimide dielectric and lift-off polyimide films.

Another object of this invention is to provide a method of forming planar metallized structures with polyimide dielectric having low TCE (Thermal Coefficient of Expansion) using bilayer lithography to pattern the polyimide, followed by metallization using metal plate-up techniques or dry deposition (sputtering or e-beam evaporation), and planarization by chemical-mechanical polishing or other methods to form planar structures.

Yet another object of this invention is to provide bilayer lithographic process for lift-off metallization with soluble polyimide underlayer thickness up to 25 $\mu$m with no cracking or surface crazing of the polyimide on application of the imaging layer or during any of the subsequent processes including lithography and $O_2$ RIE.

A further object of this invention is to provide a bilayer lithographic method as a superior alternative to the laser etch process to form via patterns in polyimide dielectric films.

In accordance with the present invention, a photosensitive silicon-containing resist composition is provided which comprises a phenolic-hydroxy-containing siloxane polymer partially esterified with diazonaphthoquinone groups selected from the group consisting of the poly(p-hydroxybenzylsilsesquioxane-co-p-methoxybenzylsilsesquioxane-co-p-(2-diazo-1-naphthoquinonesulfonyloxy)silsesquioxane represented by the formula

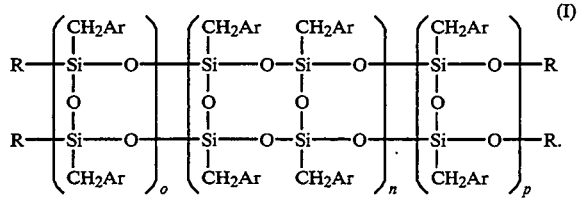

the poly(p-hydroxyphenylsilsesquioxane-co-p-methoxyphenylsilsesquioxane-co-p-(2-diazo-1-naphthoquinonesulfonyloxy)silsesquioxane) represented by the formula

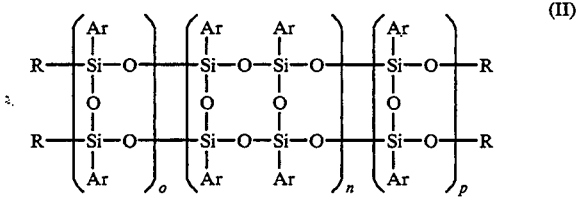

and the poly(methyl-p-hydroxybenzylsiloxane-co-methyl-p-methoxybenzylsiloxane-co-methyl-p-(2-diazo-1-naphthoquinonesulfonyloxy)siloxane) represented by the formula

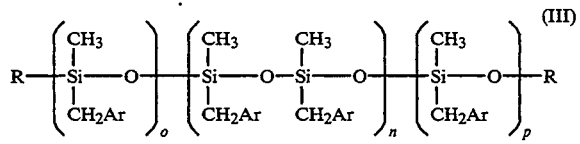

wherein (1) R is either H or Si(CH$_3$)$_3$, (2) Ar is p-hydroxyphenyl, p-methoxyphenyl or p-(2-diazo-1-naphthoquinonesulfonyloxy)phenyl as represented respectively by the formulas

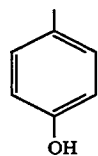

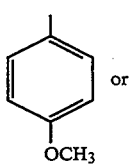

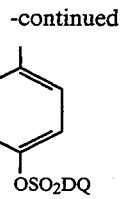

(3) DQ is a 2-diazo-1-naphthoquinone-4 residue, a 2-diazo-1-naphthoquinone-5 residue as represented respectively by the formulas

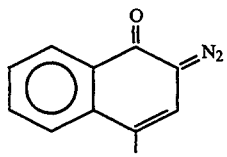

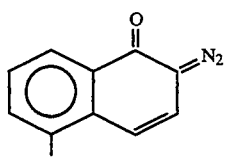

or mixtures thereof, (4) n is an integer from 5 to 9, and o and p are, independently, 0 or 1, and (5) the molar ratio of p-hydroxyphenyl group to p-methoxyphenyl group to p(2-diazo-1-naphthoquinonesulfonyloxy)phenyl group is in the range from 75:20:5 to 30:50:20.

DETAILED DESCRIPTION OF THE PREFERRED EMBODIMENTS

According to one embodiment of the present invention, a photosensitive silicon-containing O$_2$ etch resistant resist composition comprising a poly(p-hydroxybenzylsilsesquioxane-co-p-methoxybenzyl-silsesquioxane-co-p(diazonaphthoquinonesulfonyloxy-benzylsilsesquioxane is formed by reacting a 2-diazo-1-naphthoquinone-4-sulfonyl chloride, 2-diazo-1-naphthoquinone-5-sulfonyl chloride, or mixtures thereof with the phenolic —OH groups of a poly(p-hydroxybenzylsilsesquioxane-co-p-methoxybenzylsilsesquioxane). The starting silsesquioxane resins and their preparation are described in the U.S. Pat. No. 4,745,169 (Hitachi). The starting copolymer silsesquioxane is prepared from poly(p-methoxybenzylsilsesquioxane) by partial demethylation of the methoxy (—OCH$_3$) group according to known methods.

A similar process may be used to form analogous silicon-containing resist systems from poly(p-hydroxyphenysilsesquioxane-co-p-methoxyphenylsilsesquioxane) and poly(methyl-p-hydroxybenzylsiloxane-co-methyl-p-methoxybenzylsiloxane). The resultant poly(p-hydroxyphenylsilsesquioxane-co-p-methoxyphenylsilsesquioxane-co-p-(2-diazo-1-naphthoquinonesulfonyloxyphenyl)silsesquioxane) and poly(methyl-p-hydroxybenzylsiloxane-co-methyl-p-methoxybenzylsiloxane-co-methyl-p-(2-diazo-1-naphthoquinonesulfonyloxy)benzylsiloxane) compositions exhibit lithographic properties somewhat inferior to (but still quite useful) poly-(p-hydroxybenzylsilsesquioxane-co-p-methoxybenzylsilsesquioxane-co-p-

(diazonaphthoquinonesulfoyloxy)benzylsilsesquioxane).

According to the present invention, improved photosensitive silicon-containing resist compositions for bilayer resist processes are prepared by the partial esterification of the available phenolichydroxy (—OH) groups of the starting silsesquioxane or that of the siloxane polymer with 2-diazo-1-naphthoquinone-4-sulfonyl chloride, 2-diazo-1-naphthoquinone-5-sulfonyl chloride, or mixtures thereof in aqueous acetone in the presence of sodium carbonate; the product is precipitated in acidified water and recovered by filtration followed by repeated washing with deionized water and drying under vacuum. It has been found that when the relative ratio of the three functional groups (OH:OCH3:OSO2DQ) falls within the range specified in Table 1 below. The resulting resist films show unique properties in terms of lithographic performance and mechanical integrity, and etch resistance during pattern replication in relatively thick polyimide underlayers which generally require extended O2 RIE

TABLE 1

| Functionality | % by weight |
|---|---|
| —OH | 75–30 |
| —OCH3 | 20–50 |
| —OSO2DQ | 5–20 |

It has been observed that photosensitive polymer formed from a completely demethylated polymer, poly(p-hydroxybenzylsilsesquioxane) by partial esterification reaction using DQSO2Cl in a process similar to that described above yields resist films having inferior properties. Particularly, these films show high sensitivity to aqueous base and thus there is a major problem of process control in pattern development. Such polymers also exhibit the problem of cracking, especially when subjected to extended O2 RIE which is necessary for pattern replication in thick polyimide underlayers.

Since, according to the present invention, the photosensitive moiety is covalently bonded to the resin matrix, the resist formulations are prepared by simply dissolving 5–20% of the photosensitive silicon-containing resist composition, such as poly(p-hydroxybenzylsilsesquioxane-co-p-methoxybenzylsilsesquioxane-co-p(2-diazo-1-naphthoquinonesulfonyloxy)silsesquioxane) in propylene glycol monomethylether acetate (PM acetate) requiring no additional components such as sensitizers, surfactants, stabilizers, etc. Other suitable solvents include methoxy-2-propanol, ethyl lactate, ethoxyethyl propionate or mixtures thereof which mixtures may include PM acetate. The solution is filtered through 0.2 μm membrane and spin applied on polymer underlayers, prebaked, followed by lithography to pattern the resist and then O2 RIE to transfer pattern into the underlayer. The resist films are stable to the environment and require no special precautions for handling, storage or processing. The resist films are also compatible with polyimide dielectric materials and lift off materials used as underlayers.

These underlayer polymers include soluble polyimides for lift-off applications, such as polyimides carrying the hexafluoroisopropylidene (>C(CF3)2) group e.g., the polyimide formed from 6FDA/ODA polyamic acid precursor derived from 2,2'-bis-(3,4-dicarboxyphenyl)-hexafluoropropane anhydride and 4,4'-oxydianiline (e.g., RC 2566 from DuPont),

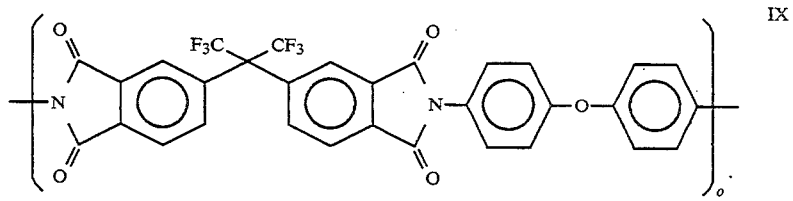

The fully imidized polyimide from a BTDA/DAPI polyamic acid precursor derived from 4,4'-benzophenonetetracarboxylicdianhydride (BTDA) and 3-(4-aminophenyl)-1,1,3-trimethyl-5-aminoindane (DAPI) (e.g., Probimide 284 from Ciba-Geigy),

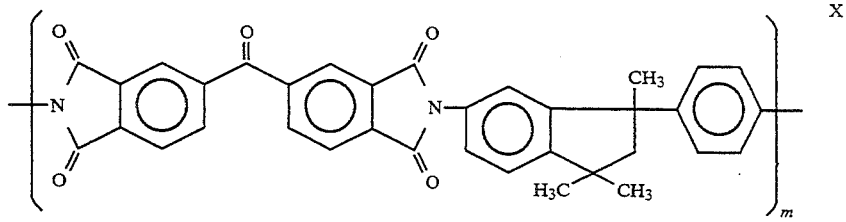

polyimides derived from ODPA (4,4'-oxydiphthalic anhydride) and ODA (4,4'-oxydianiline, 3,4'-oxydianiline, or 3,3'-oxidianiline),

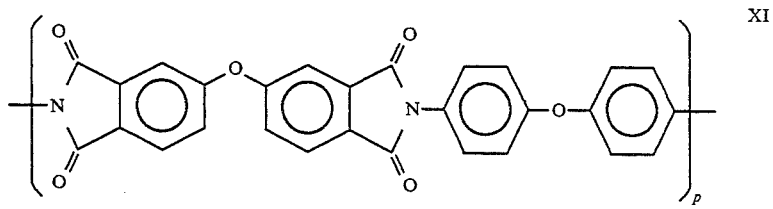

and polyimide dielectric including the low TCE polyimides typically those derived from biphenyltetracarboxylicdianhydride-p-phenylenediamine (BPDA-PDA),BPDA-benzidine, 3,3',4,4'-benzophenone tetracarboxylicdianhydride-p-phenylene diamine (BTDA-PDA), or conventional polyimides as those derived from pyromellitic dianhydride-oxydianiline (PMDA-ODA), BTDA-ODA, and BTDA-APB-APA (3,3',4,4'-benzophenonetetracarboxylic dianhydride-aminophenoxybenzene-aminophenylacetylene). The low TCE polyimides including BPDA-PDA are described in U.S. Pat. application, Ser. No. 07/503,401, filed Mar. 30, 1990, now issued as U.S. Pat. No. 5,115,090 to Sachdev, et al.

It has been observed that application of resist formulations comprising the photosensitive silicon-containing resist composition, such as poly-(p-hydroxybenzylsilsesquioxane-co-p-methoxybenzyl-silsesquioxane-co-p-(2-diazo-1-naphthoquinonesulfonyoxysilsesquioxane) over soluble polyimide layer causes no problem of surface crazing in the underlayer, even when the polyimide layer is relatively thick, typically 10–15 $\mu$m. Also, unlike the silicon-containing resists based on acid amplification, the present resist is not sensitive to environmental contaminants such as basic solvent vapors, typically NMP, which is also a common solvent for high performance polyimide coatings.

This characteristic of these new silicon-containing resists offers a unique advantage of compatibility with polyimide underlayers. The known silicon-containing resists which are based on acid amplification mechanism using onium salts as photoacid generators cannot be used in conjunction with polyimide underlayers or processed in areas where solvent like NMP is used, and require special precautions in handling, storage, and processing area contaminants control. It has been found that acid amplified resists when processed under these conditions or applied on top of 200°–250° C. baked polyimide films (which may still have traces of NMP), suffer lithographic performance degradation and sometimes complete inactivation.

The resist materials of the present invention have the following important characteristics:

Films have very high $O_2$ etch resistance in comparison to polyimides or other polymer underlayers providing etch rate ratio greater than 1:30.

Films can be patterned by broad band exposure, deep UV, i-line or g-line. The 4-sulfonate ester-DQ based systems are preferred for i-line and deep UV while the corresponding 5-isomer shows best performance under g-line exposure. With broad-band exposure, either of the two isomers can be used for high resolution pattern.

Resist sensitivity is several times greater than the diazonaphthoquinone-novolak based resists.

No adhesion promoter is required for coating of these resists on polyimide underlayers.

Important applications of the photosensitive $O_2$ RIE barrier according to this invention are in process simplification for fabrication of multilayer metal structures, particularly thin film packaging structures, as represented in the following:

Patterning of polyimide dielectric using bilayer process as an alternative to more involved and expensive techniques such as laser ablation or multilayer resist (MLR) processes.

Patterning of polyimide dielectric using bilayer process which unlike the photosensitive polyimide approach, does not interfere with the intrinsic properties of the polyimide backbone chemistry.

Fabrication of planar multilayer metal structures using polyimide insulator and bilayer process with the photosensitive $O_2$ RIE barrier to pattern polyimide at each level.

Metallization is carried out by plate-up, sputter deposition, or e-beam evaporation, followed by lift-off or by planarization for direct patterning of dielectric layers. To build next level, an $O_2$ etch stop layer is first formed on the previous level followed by second level polyimide layer and the photosensitive $O_2$ RIE barrier layer comprising the benzylsilsesquioxane resin-compositions of the form of structure I. Again, bilayer process is used to define polyimide pattern which is metallized and planarized as for the first level. Various etch stop candidates suitable for the purpose of this invention include: $SiO_2$, sputtered quartz, silicon nitride, chemical vapor deposited tetraethoxysilane (CVD TEOS), alternate plasma deposited organosilicons, hexamethyl disilazane, divinyl tetramethyldisilazane, and vinyl trialkoxysilane or solution coated silicon-containing resin, including "glass resins", and silicon-containing polyimides.

Patterning of soluble polyimide underlayers when using Expendable Mask (or Lift-off) technique for defining metallurgical pattern in the the fabrication of multilayer metal structures.

The following examples are provided to illustrate the preferred mode of practicing this invention:

EXAMPLE 1

Synthesis of poly(p-hydroxybenzylsilsesquioxane-co-p-methoxybenzylsilsesquioxane-co-p-(2-diazo-1-naphthoquinone-4-sulfonyloxy)benzylsilsesquioxane) having an $OH:OCH_3: OSO_2DQ$ ratio as 45:40:15.

A poly(p-hydroxybenzyl silsesquioxane-co-p-methoxybenzylsilsesquioxane) having a $OH:OCH_3$ ratio of 60:40 was prepared according to the procedure of U.S. Pat. No. 4,745,169, and had a weight average molecular weight 4000–5000. Relative ratio of the —OH and —$OCH_3$ groups was determined by NMR analysis in Acetone-d6 solution.

In a three neck flask equipped with an addition funnel, mechanical stirrer, and a thermometer, was added 50 g (0.3001 mole) of the starting material and 400 ml of reagent grade acetone. The mixture was stirred to dissolve, warmed to about 40°–45° C. using a heating bath, and 15 g (0.0574 mole) of 2-diazo-1-naphthoquinone-4-sulfonyl chloride was added within 5 min with gentle stirring. When a clear solution was formed, an aqueous solution of sodium carbonate containing 5.9 g sodium carbonate (0.0556 mole) in 60 mL water was added dropwise within 15–20 min while maintaining reaction temperature about 42°–45° C. After complete addition of the carbonate solution, the mixture was stirred for 30–45 min at the same temperature and then for another 45 min with the heat source removed. The inorganic solids formed during this time were removed by filtration through a coarse sintered glass funnel and the product was precipitated from the filtrate by dropwise addition into acidified ice-cold water containing 18 mL conc. HCl in 4 liter of deionized water. The rate of addition is adjusted such that a fine precipitate is formed and not an agglomerated semisolid. The precipitate was collected by filtration, washed repeatedly with ice-cold deionized water till the filtrate had neutral pH. The solid was air dried overnight and then vacuum dried to constant weight.

EXAMPLE 2-5

By similar synthesis, the following photosensitive silicon-containing resist compositions were prepared:

Poly(p-hydroxybenzylsilsesquioxane-co-p-methoxybenzyl-silsesquioxane-co-p-(2-diazo-1-naphthoquinione-4-sulfonyloxy)benzylsilsesquioxane having an $OH:OCH_3:OSO_2DQ$ ratio of 57.5:30:12.5 (Example 2)

Poly(p-hydroxybenzylsilsesquioxane-co-p-methoxybenzyl-silsesquioxane-co-p(2-diazo-1-napthoquinone-5-sulfonyloxy)benzylsilsesquioxane) having an $OH:OCH_3:OSO_2DQ$ ratio of 57.5:30:12.5. (Example 3)

Poly(p-hydroxybenzylsilsesquioxane-co-p-methoxybenzylsilsesquioxane-co-p-(2-diazo-1-napthoquinone-5-sulfonyloxy)benzylsilsesquioxane) having an $OH:OCH_3:OSO_2DQ$ ratio of 64.0:25.0:11.0 (Example 4)

Poly(p-hydroxybenzylsilsesquioxane-co-p-methoxybenzylsilsesquioxane-co-p(2-diazo-1-napthoquinone-5-sulfonyloxy) benzyl silsesquioxane) having an $OH:OCH_3:OSO_2DQ$ ratio of 64.0:25.0:11.0 (Example 5)

Table 2 shows the reactants for the resists of Examples 1-5. The processing conditions were essentially the same.

TABLE 2

| Example Number | Benzylsilsesquioxane (g) | $OH:CH_3$ ratio | acetone (mL) | $DQSO_2Cl$ (g) | $Na_2CO_3/$ (form) | $HCl/H_2O$ (g/mL) | $H_2O$ (mL/L) |
|---|---|---|---|---|---|---|---|
| 1 | 50 | 60:40 | 400 | 15.0 | 2,1,4- | 5.9/60 | 18/4 |
| 2 | 50 | 70:30 | 400 | 11.5 | 2,1,4- | 4.8/60 | 15/4 |
| 3 | 50 | 70:30 | 400 | 11.5 | 2,1,5- | 4.8/60 | 15/4 |
| 4 | 75 | 75:25 | 550 | 19.2 | 2,1,4- | 7.5/80 | 20/5 |
| 5 | 75 | 75:25 | 550 | 19.2 | 2,1,5- | 7.5/80 | 20/5 |

The compounds were made and exhibited good lithographic properties as is seen in the following examples.

Bilayer Lithographic Process:

EXAMPLE 6

A resist formulation was prepared by dissolving the photosensitive silicon-containing of Example 2 in propylene glycol monomethylether acetate (PM-acetate) to form a 18% solution (w/w) and filtering through 0.2 μm membrane filter.

Resist performance was tested with coating the resist formulation on silicon wafers. Typical thickness obtained was about 0.5-0.55 μm at 2000 rpm spin speed. The films on silicon wafers were prebaked at 85°-90° C. for 2-3 min (hot plate) or oven bake at 85° C. for 10-15 min, and patternwise exposed on Oriel exposure tool at about 50-60 mJ/cm² dose. Immersion development of the exposed resist in 0.1-0.15N tetramethyl ammonium hydroxide (TMAH) required 45-60 sec for complete removal of the resist formulation in the exposed region with less than 5% thickness loss in the unexposed region. Excellent quality residue-free images were obtained with no evidence of resist thinning or adhesion failure.

EXAMPLE 7

Bilayer Lithography for Lift-off Metallization:

A layer of a fully imidized soluble polyimide XU293 (Ciba-Geigy's Probimide) in gamma-butyrolactone solution was spin coated on a surface treated silicon wafer (by exposing to $O_2$ plasma followed by spin application of 0.1% solution of A1100 as adhesion promoter) and subjected to a bake cycle involving 85° C. for 30 min., 150° C. for 30 min., and 230°-240° C. for 30 min. in a convection purged oven. Polyimide thickness after the bake was 11-12 μm. A resist formulation was prepared by dissolving the photosensitive silicon-containing resist composition of Example 4 in PM acetate. This formulation was filtered as described in Example 6 and spin applied over the polyimide layer at 2000 rpm for 30-45 sec, and prebaked at 85° C. for 15 min in an oven. Resist was patternwise exposed to i-line (365 nm) at 75 mJ/cm² and developed with 0.12N TMAH followed by thorough rinse with deionized water and blow drying with $N_2$. Excellent quality resist patterns were formed with no evidence of resist thinning or adhesion failure.

Prior to $O_2$ RIE etch to transfer the resist pattern into the underlying polyimide, the patterned wafers were heated at 100°-120° C. for 45-60 min in order to remove any trapped solvent, to cause densification of the resist film, and to thermally deactivate the naphthoquinonediazido functional groups. This treatment was found to be particularly beneficial for RIE etch into thick underlayers since it results in minimal erosion of the resist mask even when extended RIE is necessary. Without the post-develop heat treatment, significant erosion of the resist layer was observed when etching into more than 5 μm thick underlayers. (In some cases the resist pattern was baked up to 180° C. before $O_2$ RIE etch into the underlayer). Subsequently, the resist pattern was transferred into the underlayer by $O_2$ RIE in a Plasma-Therm-2400 RIE tool with 22" cathode (cooled to 23°) at 750-1000 watts, 300 mTorr, and 200 SCCM $O_2$ flow, with 40-50% overetch. This was followed by 15-20 sec rinse in 10:1 buffered HF to remove any residues, thorough rinse in DI water, blow dry, and oven bake at 100° C. for 30 min. Microscopic examination and SEMs (scanning electron micrographs) of the etched patterns showed residue-free patterns with excellent overhang profile for lift-off metallization, and no evidence of resist flow or image distortion. Metallization was carried out by blanket deposition of 200 Å Cr and a thick layer of Cu followed by immersion in NMP with agitation at 85° C. when the lift-off stencil was removed leaving behind excellent quality metal pattern.

EXAMPLE 8

Bilayer Lithographic Process for Patterning Low TCE Polyimide BPDA-PDA Dielectric Layer on Ceramic Substrate A glass ceramic substrate was surface cleaned by exposing to $O_2$ plasma for 10-15 min at 500 watts, surface treated with 0.1% solution of gamma-aminopropyl triethoxysilane (A1100) in aqueous ethanol (typically 95:5 $EtOH:H_2O$ ), and BPDA-PDA derived polyamic acid having solution viscosity about 29,000-32,000 centistokes (about 14.5% solids in NMP) was spin applied at 2000 rpm for 60 sec. This was followed by bake/cure cycle as 85°–90° C./45 min, 150° C./45 min, 230° C./30 min, 300° C./30 min, and 350°–400° C./60 min to obtain 10–12 μm thick fully cured low TCE polyimide film as underlayer.

The resist solution of Example 6 was spin applied on the top of the polyimide at 1800 rpm/45 sec, and baked at 85° C. for 25 min in a convection oven. The resist was imagewise exposed using 75 mJ/cm² i-line exposure dose, and developed with 0.12N TMAH for 45–55 sec followed by DI water rinse and blow dry. As described in example 8, prior to O₂ RIE, the substrates were heated at 110°–120° C. for 1 hr, and then the resist pattern was etch transferred into the underlayer by O₂ RIE without subjecting to overetch. Any residues after the RIE were removed by 15–20 sec rinse in 10:1 buffered HF followed by DI water rinse and blow dry. Microscopic examination showed excellent quality polyimide patterns with no evidence of flow or distortion of resist images. Metallization of the polyimide patterns was carried out by sputter depositing 200 Å Cr as adhesion layer and 1 μm of Cu as seed layer followed by Cu plate-up and chemical-mechanical polishing to form planarized structure such that the metal features are co-planar with the polyimide dielectric in-between these features.

EXAMPLE 9

Bilayer lithographic process for defining metal pattern into polyimide dielectric layer using a metal lift-off method: Terminal via metal deposition.

After building a multilayer thin film interconnect structure using polyimide dielectric and Cu or other high conductivity metal circuits, the terminal layer for joining metallurgy was formed as follows:

The surface of the metal/polyimide structure was activated by O₂ RIE for 2–4 min at 200–400 w and 50–100 mTorr O₂ pressure, followed by spin application of 0.1% A1100 in 95:5 ethanol-H₂O to further modify the surface with adhesion promoter. For low TCE polyimide, BPDA-PDA polyamic acid precursor was applied and baked/cured to 380°–400° C. in an inert ambient (N₂ or forming gas) using the following thermal cycle: 85° for 30 min, to 150° for 30 min, to 230° for 30 min to 300° for 30 min to 380°–400° for 46–60 min (the ramp rate between each temperature level was about 2°/min), to form a polyimide dielectric/insulator layer. Again, the polyimide is activated by O₂ RIE and modified by application of A1100 adhesion promoter. A lift-off polyimide (soluble polyimide) was then formed over the BPDA-PDA layer by spin applying XU 287, XU 293, or equivalent formulation of fully imidized Probimide series polyimide from Ciba Geigy, or RC2566 polyamic acid and baking to 200°–230° C. The silicon containing photosensitive resist of Example 4, at 20–22% solids in PM-Acetate, was then applied and dried/baked at 85° for 15–20 min in an oven. The resist was imagewise exposed at 50–75 mJ/cm² using i-line, g-line or broadband exposure and developed in 0.12N TMAH for 30–40 sec, followed by thorough rinse with deionized water, and bake up to 110°–130° C. for 30–60 min. The resist pattern was etched into the underlying lift-off polyimide and BPDA-PDA dielectric stack with over etch to create an overhang. Any residue after O₂ RIE was removed by 10–15 sec rinse in buffered HF (1:10 or 1:20) and thorough rinse with deionized water. This is followed by deposition of desired metallurgy corresponding to the thickness of the BPDA-PDA dielectric layer, such as Cr/Cu/Ni/Au or Cr/Cu/- Co/Au and metal lift-off operation by NMP soak (with agitation or ultrasonics if required), to obtain terminal metal in the BPDA-PDA passivation layer. Subsequent chip join operations complete the top surface structure build.

Although this invention has been described with respect to specific embodiments the details thereof are not to be construed as limitations, for it will become apparent that various embodiments, changes and modifications may be resorted to with and departing from the spirit and scope thereof, and it is understood that such equivalent embodiments are intended to be included within the scope of this invention.

We claim:

1. A photosensitive silicon-containing resist composition comprising a phenolic hydroxyl group containing siloxane polymer partially esterified with diazonaphthoquinone groups selected from the group consisting of the poly(p-hydroxybenzyl-silsesquioxane-co-p-methoxybenzyl-silsesquioxane-co-p-(2-diazo-1-naphthoquinonesulfonyloxy)silsesquioxane) represented by the formula

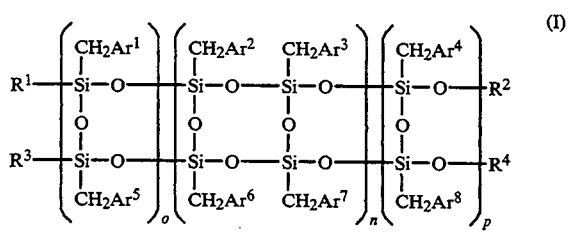

the poly(p-hydroxyphenyl-silsesquioxane-co-p-methoxyphenyl-silsesquioxane-co-p-(2-diazo-1-naph-thoquinonesulfonyloxy)silsesquioxane) represented by the formula

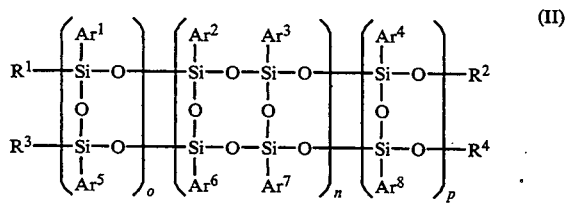

and the poly (methyl-p-hydroxybenzylsiloxane-co-methyl-p-methoxybenzylsiloxane-co-methyl-p-(2-diazo-1-naphthoquinonesulfonyloxy)siloxane) represented by the

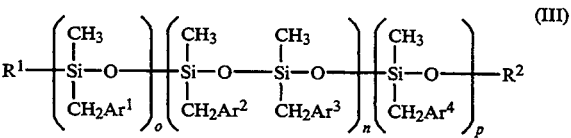

wherein
(1) each $R^1$ to $R^4$ group is individually selected from group consisting of H and $Si(CH_3)_3$,
(2) each $Ar^1$ to $Ar^8$ group is individually selected from the group consisting of p-hydroxyphenyl, p-methoxyphenyl and p-(2-diazo-1-naphthoquinonesulfonyloxy)phenyl, as represented respectively by the formulas

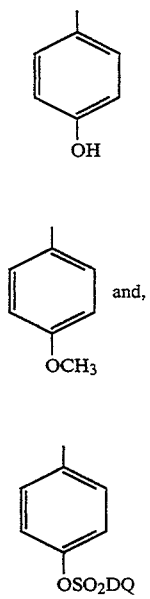

so that the molar ratio in said polymer of p-hydroxyphenyl groups to p-methoxyphenyl groups to p(2-diazo-1-naphthoquinonesulfonyloxy)phenyl groups is in the range from 75:20:5 to 30:50:20, (3) DQ is a 2-diazo-1-naphthoquinone-4 residue, a 2-diazo-1-naphthoquinone-5 residue as represented respectively by the formulas or mixtures thereof, and
(4) n is an integer from 5 to 9, and
(5) o and p are, independently, 0 or 1.

2. The photosensitive silicon-containing resist composition of claim 1 comprising the polybenzylsilsesquioxane polymer selected from the group consisting of poly-(p-hydroxybenzylsilsesquioxane-co-p-methoxybenzylsilsesquioxane-co-p-(2-diazo-1-naphthoquinone-4-sulfonyloxy)-benzylsilsesquioxane) and poly-(p-hydroxybenzylsilsesquioxane-co-p-methoxybenzylsilsesquioxane-co-p-(2-diazo-1-naphthoquinone-5-sulfonyloxy)-benzylsilsesquioxane).

3. The composition of claim 1 having weight average molecular weight of 4000–6000 with respect to polystyrene standard.

4. The photosensitive silicon-containing resist composition of claim 1 which comprises 80–95% by weight of a solvent selected from the group consisting of propylene glycol monomethyl ether acetate, methoxy-2-propanol, ethyl lactate, ethoxyethyl propionate and mixtures thereof.

* * * * *